United States Patent
Fornara

(10) Patent No.: US 8,759,898 B2
(45) Date of Patent: Jun. 24, 2014

(54) MEMORY WITH A READ-ONLY EEPROM-TYPE STRUCTURE

(75) Inventor: Pascal Fornara, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 259 days.

(21) Appl. No.: 12/990,682

(22) PCT Filed: May 12, 2009

(86) PCT No.: PCT/FR2009/050868
§ 371 (c)(1),
(2), (4) Date: Nov. 29, 2010

(87) PCT Pub. No.: WO2009/147347
PCT Pub. Date: Dec. 10, 2009

(65) Prior Publication Data
US 2011/0108902 A1    May 12, 2011

(30) Foreign Application Priority Data

May 13, 2008 (FR) ...................................... 08 53069

(51) Int. Cl.
*H01L 29/788* (2006.01)
(52) U.S. Cl.
USPC .................... 257/315; 257/321; 257/E29.129; 257/E29.3
(58) Field of Classification Search
USPC .............. 257/315, 317, 321, E29.129, E29.3, 257/E21.179, E21.68; 365/185.01, 185.24; 438/211, 257
See application file for complete search history.

(56) References Cited

U.S. PATENT DOCUMENTS

| 5,040,147 | A | * | 8/1991 | Yoshizawa et al. | ....... 365/185.28 |
| 5,208,175 | A | * | 5/1993 | Choi et al. | ..................... 438/261 |
| 5,792,697 | A |   | 8/1998 | Wen | |
| 5,898,197 | A |   | 4/1999 | Fujiwara | |
| 6,259,132 | B1 |  | 7/2001 | Pio | |
| 2002/0024862 | A1 | * | 2/2002 | Hashidzume et al. | ........ 365/201 |
| 2002/0038818 | A1 | * | 4/2002 | Zingher et al. | ................ 235/381 |
| 2003/0111684 | A1 |   | 6/2003 | Park | |
| 2006/0170026 | A1 | * | 8/2006 | Wong et al. | .................... 257/314 |
| 2007/0047303 | A1 |   | 3/2007 | Kim | |
| 2007/0262372 | A1 |   | 11/2007 | Yamamoto et al. | |

FOREIGN PATENT DOCUMENTS

| JP | 57130473 | A | * | 8/1982 | ............. H01L 29/78 |
| JP | 6367783 | A |   | 3/1988 | |
| JP | 63067783 | A | * | 3/1988 | ............. H01L 29/78 |
| JP | 1197653 | A |   | 4/1999 | |
| JP | 2006339599 | A |   | 12/2006 | |
| JP | 2007305668 | A |   | 11/2007 | |

OTHER PUBLICATIONS

English language translation of the International Preliminary Examination Report dated Dec. 29, 2010 from corresponding International Application No. PCT/FR2009/050868.
International Search Report dated from corresponding International Application No. PCT/FR2009/050868.

* cited by examiner

*Primary Examiner* — Hoai V Pham
(74) *Attorney, Agent, or Firm* — Wolf, Greenfield & Sacks, P.C.

(57) ABSTRACT

A non-volatile memory including at least first and second memory cells each including a storage MOS transistor with dual gates and an insulation layer provided between the two gates. The insulation layer of the storage transistor of the second memory cell includes at least one portion that is less insulating than the insulation layer of the storage transistor of the first memory cell.

19 Claims, 6 Drawing Sheets

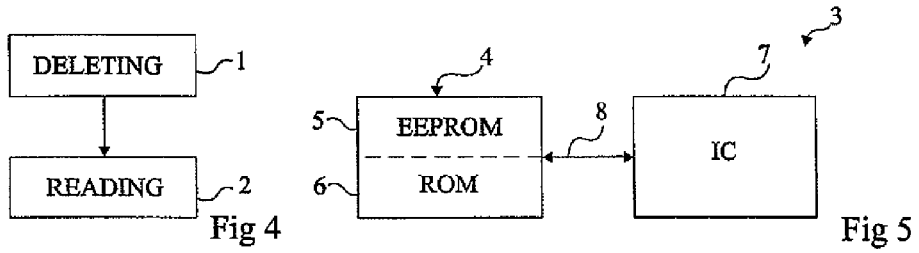
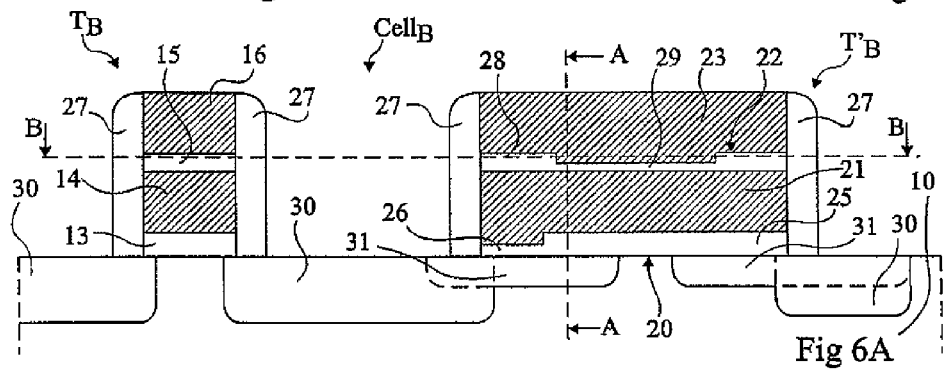
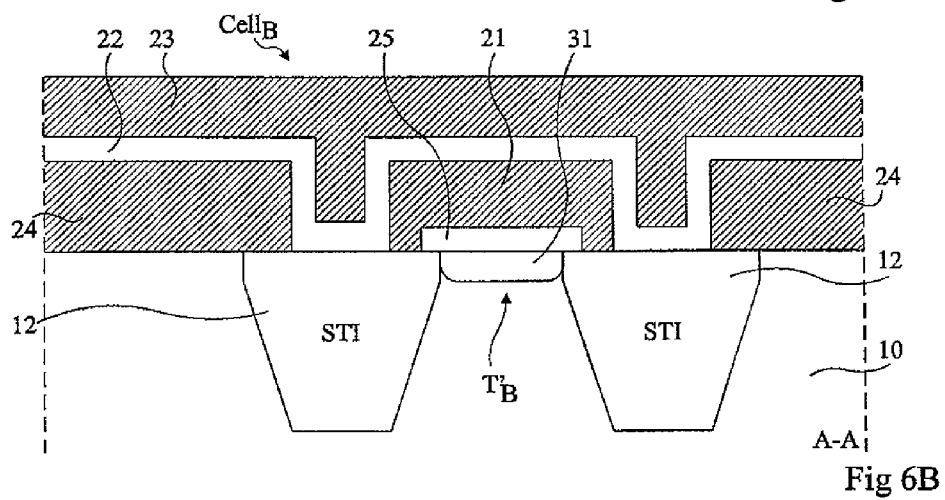
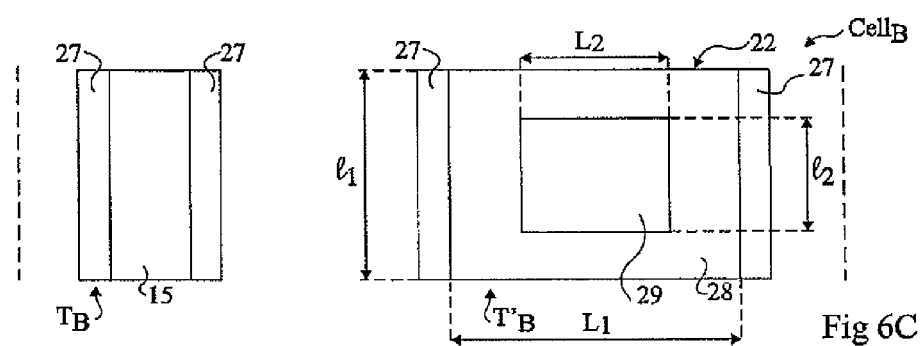

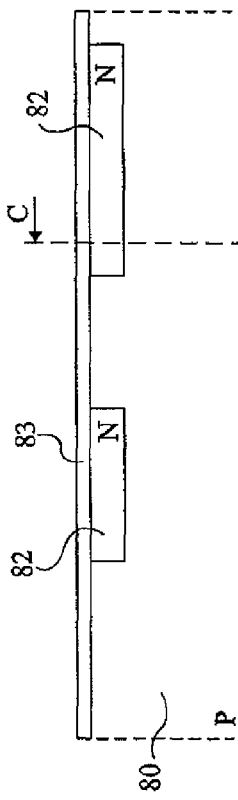
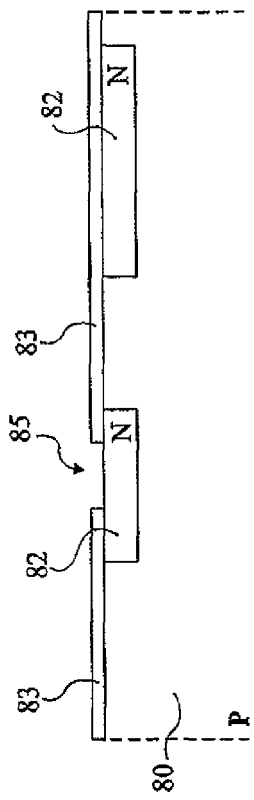
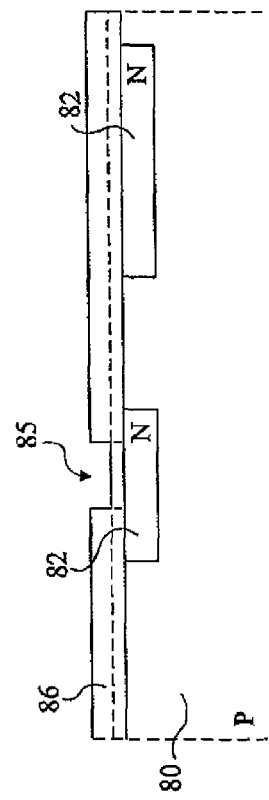
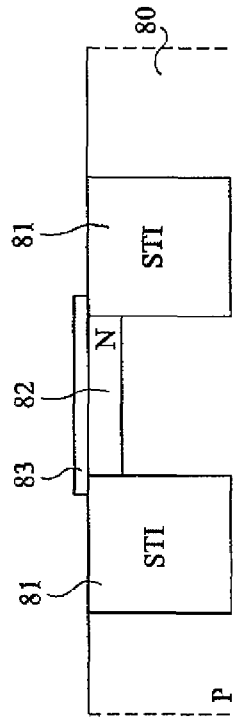
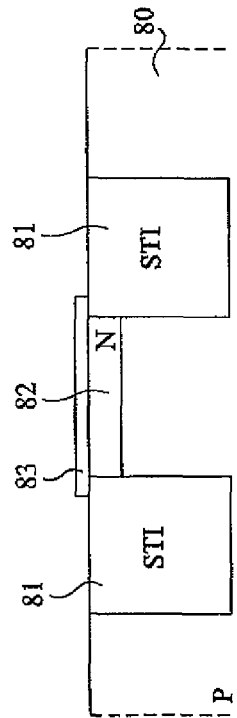
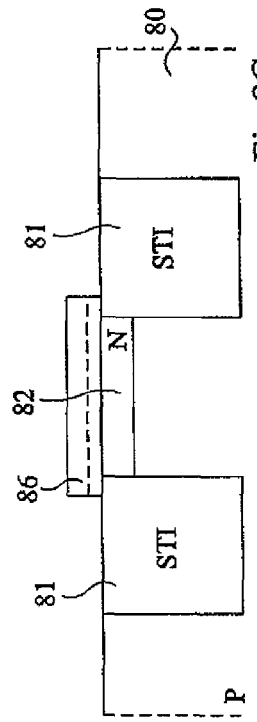

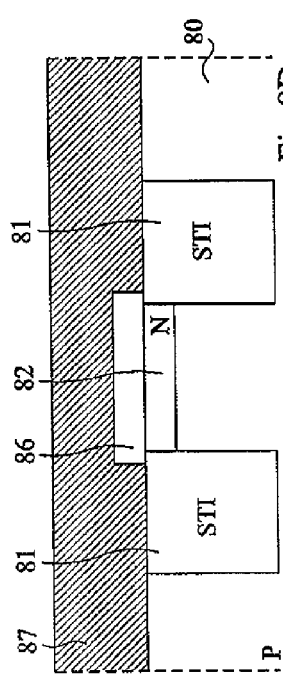
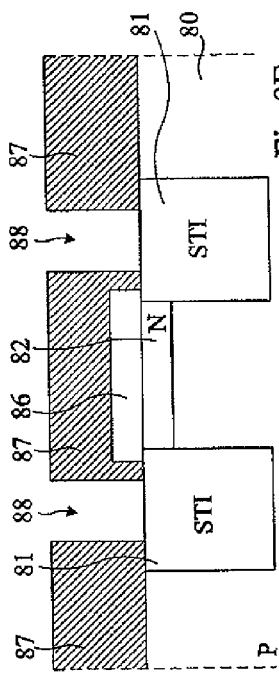
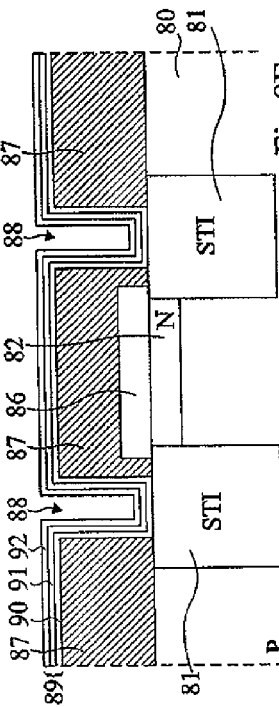
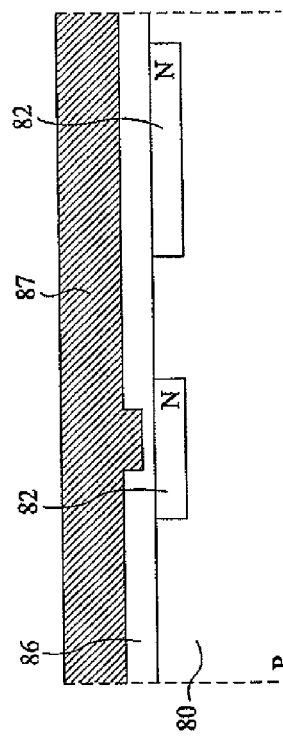
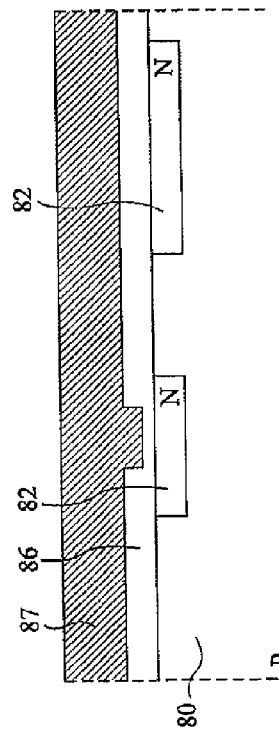
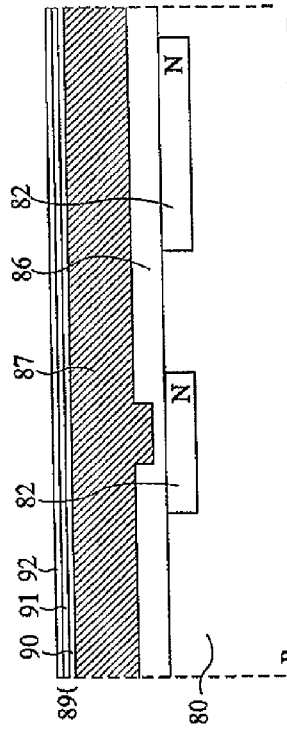

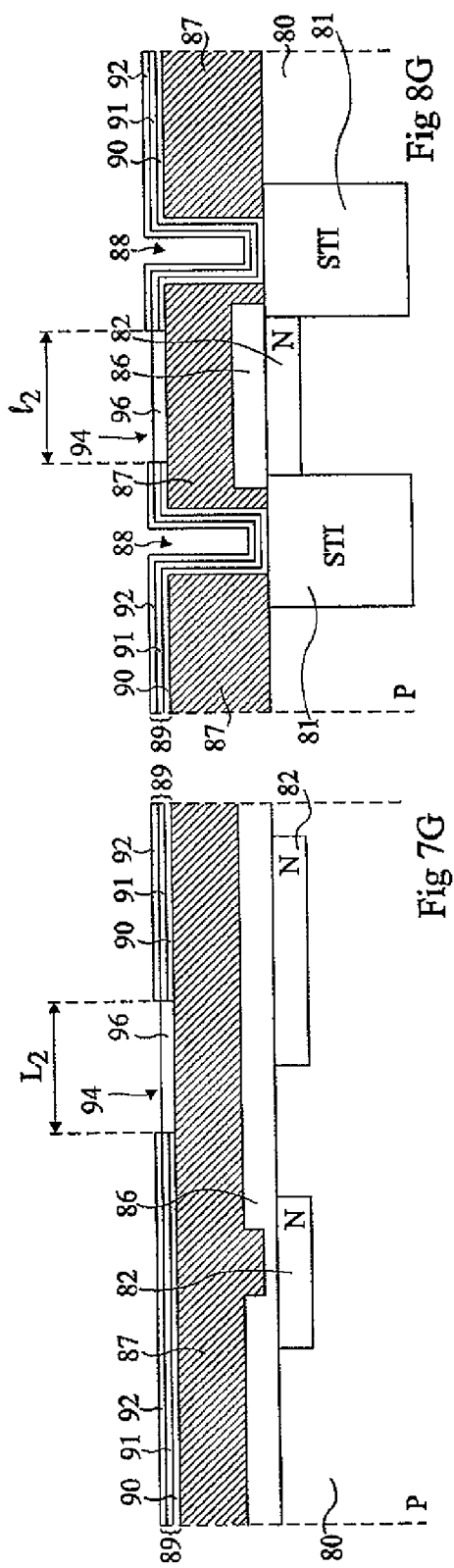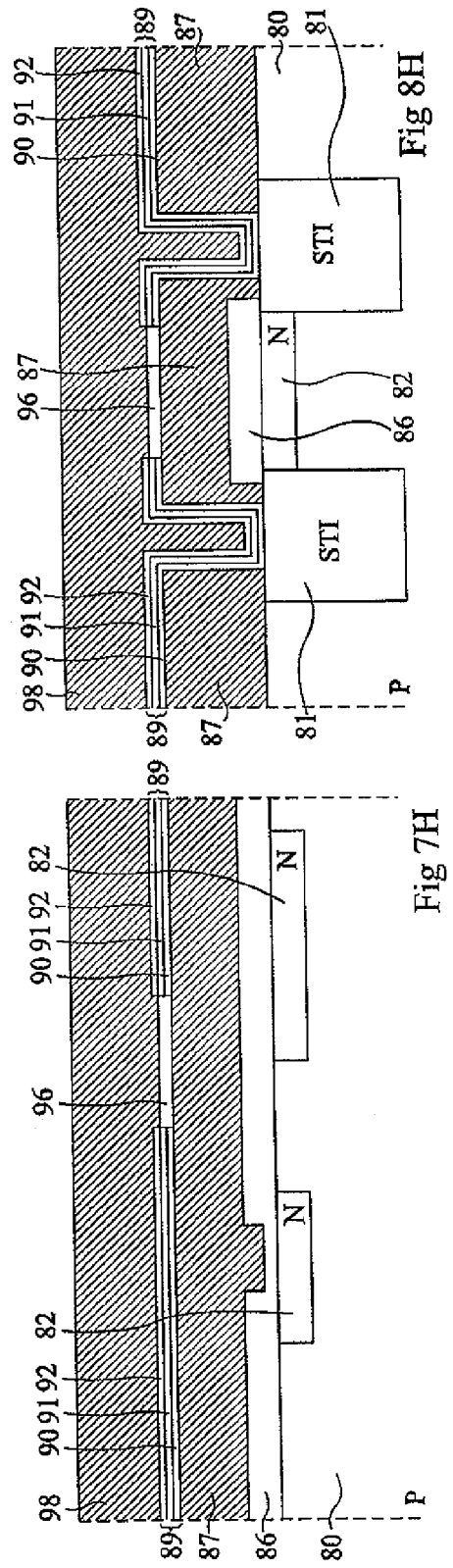

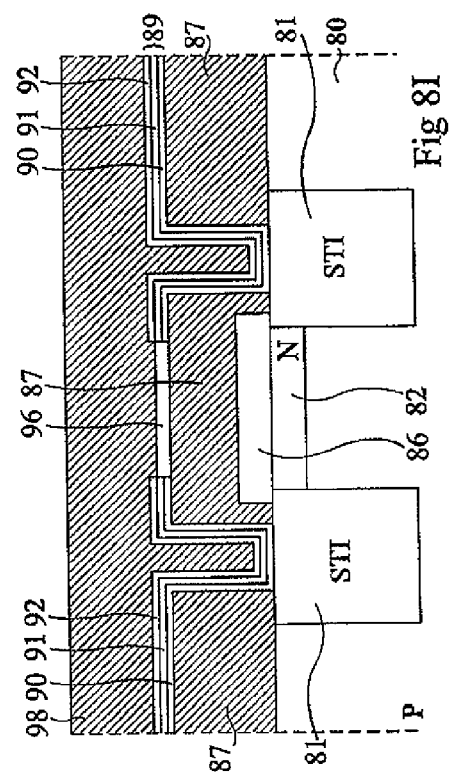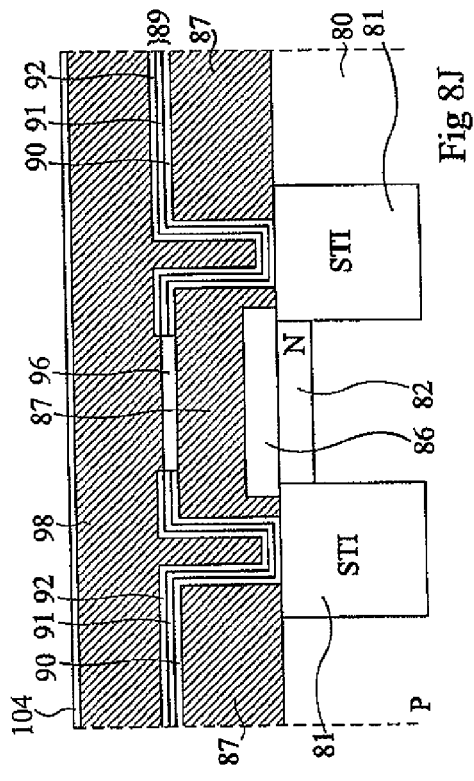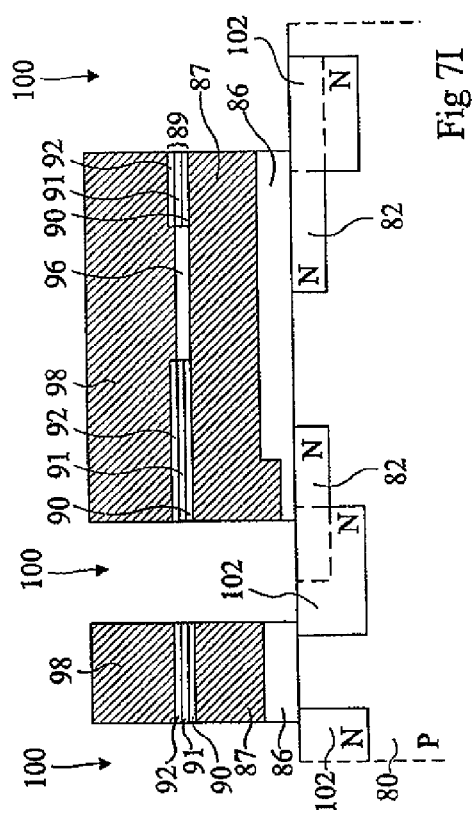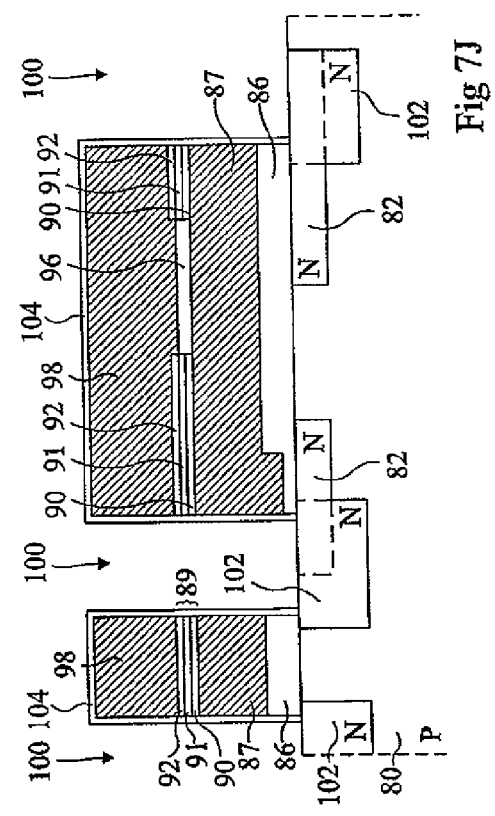

MEMORY WITH A READ-ONLY EEPROM-TYPE STRUCTURE

CROSS REFERENCE TO RELATED APPLICATIONS

This application is a U.S. National Stage patent application based on PCT application number PCT/EP2009/050868, filed on May 12, 2009, entitled "Read-Only Memory With EEPROM Structure", which application claims the priority benefit of French patent application number 08153069, filed on May 13, 2008, entitled "Read-Only Memory With EEPROM Structure," which applications are hereby incorporated by reference to the maximum extent allowable by law.

BACKGROUND OF THE INVENTION

1. Field of the Invention

The present invention generally relates to integrated circuits and, more specifically, to the non-volatile storage in an integrated circuit of a coding set on manufacturing of the circuit.

2. Discussion of the Related Art

Electrically erasable and programmable read-only memories or EEPROMs are frequently used in integrated circuits. Commercially-available EEPROMs have standard storage capacities. A user needing, for a specific application, a given storage capacity will generally use the standard EEPROM having the storage capacity just greater than the desired storage capacity. Thereby, it is possible for part of the EEPROM not to be used in operation.

Further, in many cases, it is needed to definitely code, on manufacturing of the integrated circuit, digital words in a memory or logic states conditioning the circuit operation. For this purpose, a read-only non-volatile memory or ROM-type memory is generally used.

It would be desirable to be able to modify, simply and at a decreased cost, a portion of an EEPROM to use it as a read-only memory. This would enable obtaining an EEPROM having a portion which would conventionally operate as an electrically erasable and programmable non-volatile memory and having another portion which would operate as a read-only memory. The memory load would thus be optimized.

For conventional read-only memories, the coding is performed by interconnecting the drain and source of transistors forming the memory cells so that the state read from the cell depends on the presence of this connection. The first metallization level of the structure is generally used to perform this programming.

A disadvantage of such a programming is that it is visible by analysis of the mask used to form the interconnection level, for example, by reconstruction of this mask from a circuit (reverse engineering).

SUMMARY OF THE INVENTION

At least one embodiment of the present invention aims at forming a read-only memory having a structure close to that of an EEPROM and for which the programming of the logic state is invisible by analysis of the mask for defining the interconnect levels of the structure.

Thus, an embodiment of the present invention provides a non-volatile memory comprising at least first and second memory cells, each comprising a first storage MOS transistor with a dual gate having an insulating layer interposed between the two gates. The insulating layer of the storage transistor of the second memory cell comprises at least one portion which is less insulating than the insulating layer of the storage transistor of the first memory cell.

According to an embodiment of the present invention, the insulating layer of the storage transistor of the first memory cell has a first thickness greater than 100 nm and said portion of the insulating layer of the storage transistor of the second memory cell has a second thickness smaller than 5 nm.

According to an embodiment of the present invention, the insulating layer of the storage transistor of the second memory cell comprises an additional portion having the first thickness completely surrounding said portion having the second thickness.

According to an embodiment of the present invention, the insulating layer of the storage transistor of the first memory cell having the first thickness is formed of a stack of a first silicon oxide layer, of a silicon nitride layer, and of a second silicon oxide layer and the portion having the second thickness of the insulating layer of the storage transistor of the second memory cell is formed of a third silicon oxide layer.

According to an embodiment of the present invention, the storage transistor of the first and second memory cells comprises a stack of a first insulating layer, of a first gate, of a second insulating layer, and of a second gate, the second insulating layer of the storage transistor of the second memory cell comprising said at least one portion. The memory further comprises a substrate of a semiconductor material, the first insulating layer covering the substrate and comprising a first insulating portion thinner than a second insulating portion.

An embodiment of the present invention aims at an electronic system comprising a memory such as defined previously and an integrated circuit separate from the memory and connected to the memory.

An embodiment of the present invention aims at a method for forming a memory comprising at least first and second memory cells, each comprising a dual-gate MOS storage transistor having an insulating layer interposed between the two gates. The method comprises the step of forming, in the insulating layer of the storage transistor of the second memory cell, at least one portion which is less insulating than the insulating layer of the storage transistor of the first memory cell.

According to an embodiment of the present invention, the method comprises, for each of the first and second memory cells, after a step of forming a first gate of the storage transistor and before a step of forming a second gate of the storage transistor, the successive steps of forming, for the first and second memory cells, on the first gate, a first insulating layer; forming, only for the second memory cell, an opening in the first insulating layer; forming, in said opening, a second insulating layer which is less insulating than the first insulating layer.

According to an embodiment of the present invention, the first insulating layer is formed of a stack of a first silicon oxide layer, of a silicon nitride layer, and of a second silicon oxide layer, and the second insulating layer is formed of a third silicon oxide layer.

An embodiment of the present invention aims at a method for reading from the previously-defined memory, comprising the successive steps of injecting, for each of the first and second memory cells, charges into a first gate from among the two gates of the storage transistor, which results, for the first memory cell, in a storage of the charges in the first gate and, for the second memory cell, in an evacuation of the charges from the first gate to the other one of the two gates; and measuring data representative of the charges stored in the to first gate for the first and second memory cells.

The foregoing objects, features, and advantages of the present invention will be discussed in detail in the following non-limiting description of specific embodiments in connection with the accompanying drawings.

BRIEF DESCRIPTION OF THE DRAWINGS

FIG. 4 shows, in the form of a block-diagram, the steps of a method for reading from the memory of FIG. 3 according to an embodiment of the present invention;

FIG. 5 schematically shows an electronic circuit comprising a read-only memory according to an embodiment of the present invention;

FIGS. 6A to 6C illustrate, along perpendicular cross-section planes, an embodiment of the structure of the memory cell of FIG. 2; and FIGS. 7A to 7J and 8A to 8J are cross-section views respectively along perpendicular cross-section planes of structures obtained at successive steps of an example of a method for manufacturing the memory cell shown in FIGS. 6A and 6C.

DETAILED DESCRIPTION

Figure 1:
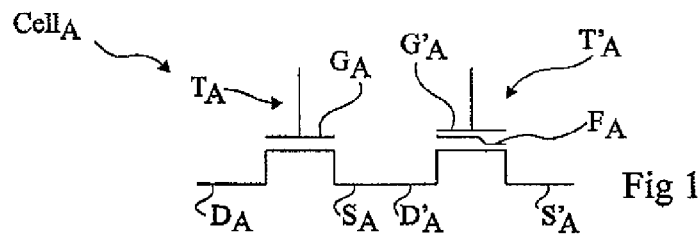
FIG. 1 is an electric diagram of an EEPROM cell.

The same elements have been designated with the same reference numerals in the different drawings. For clarity, only those elements and steps which are useful to the understanding of the present invention have been shown and will be described.

FIG. 1 is an electric diagram of a memory cell $Cell_A$ constitutive of an EEPROM. Memory cell $Cell_A$ comprises a selection transistor $T_A$ and a storage transistor $T_A'$ or memory point. Transistor $T_A$ is a MOS transistor comprising a drain $D_A$, a source $S_A$, and an insulated gate $G_A$. Memory point $T_A'$ is a MOS transistor of dual-gate type. It comprises a drain $D_A'$, a source $S_A'$, and two insulated gates, that is, a floating gate $F_A$ and a control gate $G_A'$. A memory point $T_A'$ having the insulator of its floating gate $F_A$ comprising at least a portion with sufficiently low insulation properties, for example, which is sufficiently thin, to enable passing, by tunnel effect, of carriers between the underlying channel and floating gate $F_A$ is here considered. The thin portion of the insulator of floating gate $F_A$ is called "tunnel insulator", "tunnel oxide", or "tunnel window". Source $S_A$ of transistor $T_A$ is connected to drain $D_A'$ of memory point $T_A'$.

The operation of memory cell $Cell_A$ is the following. A delete operation is carried out in the memory cell by turning on selection transistor $T_A$, by setting drain $D_A'$ and source $S_A'$ to 0 volt, and by setting control gate $G_A'$ to a delete potential. This causes the passing of charges (for example, of electrons when gate $G_A'$ is set to a positive delete potential) from drain $D_A'$ to floating gate $F_A$ through the tunnel window and the accumulation of charges in floating gate $F_A$. A write operation into memory cell $Cell_A$ is carried out by turning on selection transistor $T_A$, by applying a write voltage between drain $D_A'$ and source $S_A'$, and by maintaining control gate $G_A'$ at 0 volt. This causes the evacuation of the charges stored in floating gate $F_A$ through the tunnel window. A read operation is performed by turning on selection transistor $T_A$, by applying a read voltage, smaller than the write voltage, between drain $D_A'$ and source $S_A'$, and by setting control gate $G_A'$ to a given read potential. The threshold voltage of transistor $T_A'$ is higher when charges are stored in floating gate $F_A$. The intensity of the current crossing memory point $T_A'$ is then representative of the presence or of the absence of charges in floating gate $F_A$. As an example, it is considered that logic value "0" is stored in memory cell $Cell_A$ when charges are stored in floating gate $F_A$ of memory point $T_A'$ and that logic value "1" is stored in memory cell $Cell_A$ when floating gate $F_A$ of memory point $T_A'$ contains no charges.

At least one embodiment of the present invention aims at modifying certain cells of an EEPROM so that the EEPROM can be used, totally or partly, as a ROM.

Figure 2:
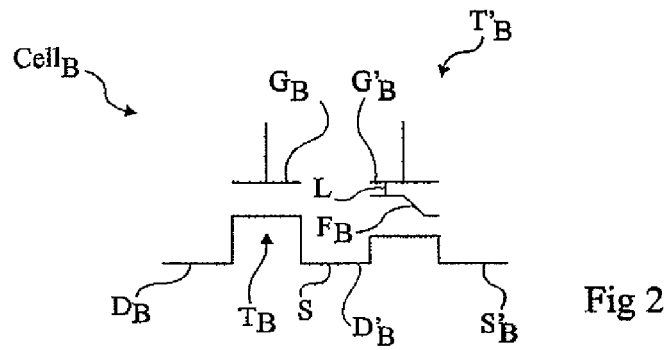
FIG. 2 is an electric diagram of an EEPROM cell modified according to an embodiment of the present invention.

FIG. 2 schematically shows an example of a modified EEPROM cell $Cell_B$. Memory cell $Cell_B$ has the same structure as EEPROM cell $Cell_A$ of FIG. 1, with the difference that the insulating layer located between floating gate $F_B$ and control gate $G_B'$ of memory point or storage transistor $T_B'$ is modified to enable a leakage of the charges stored in floating gate $F_B$ towards control gate $G_B'$. As an example, as will be described in further detail hereafter, a portion which is less insulating than the rest of the insulating layer is provided at the level of the insulating layer separating floating gate $F_B$ from control gate $G_B'$, to enable the passing of the charges stored in floating gate $F_B$ towards control gate $G_B'$. It may be a thin portion of an insulating material. It may also be a portion of a conductive material connecting floating gate $F_B$ to control gate $G_B'$. The dimensions of the less insulating portion are selected so that the leakage of the charges stored in floating gate $F_B$ towards control gate $G_B'$ is as fast as possible. The passing of the charges between floating gate $F_B$ and control gate $G_B'$ has been symbolized by a line designated with reference L.

Figure 3:
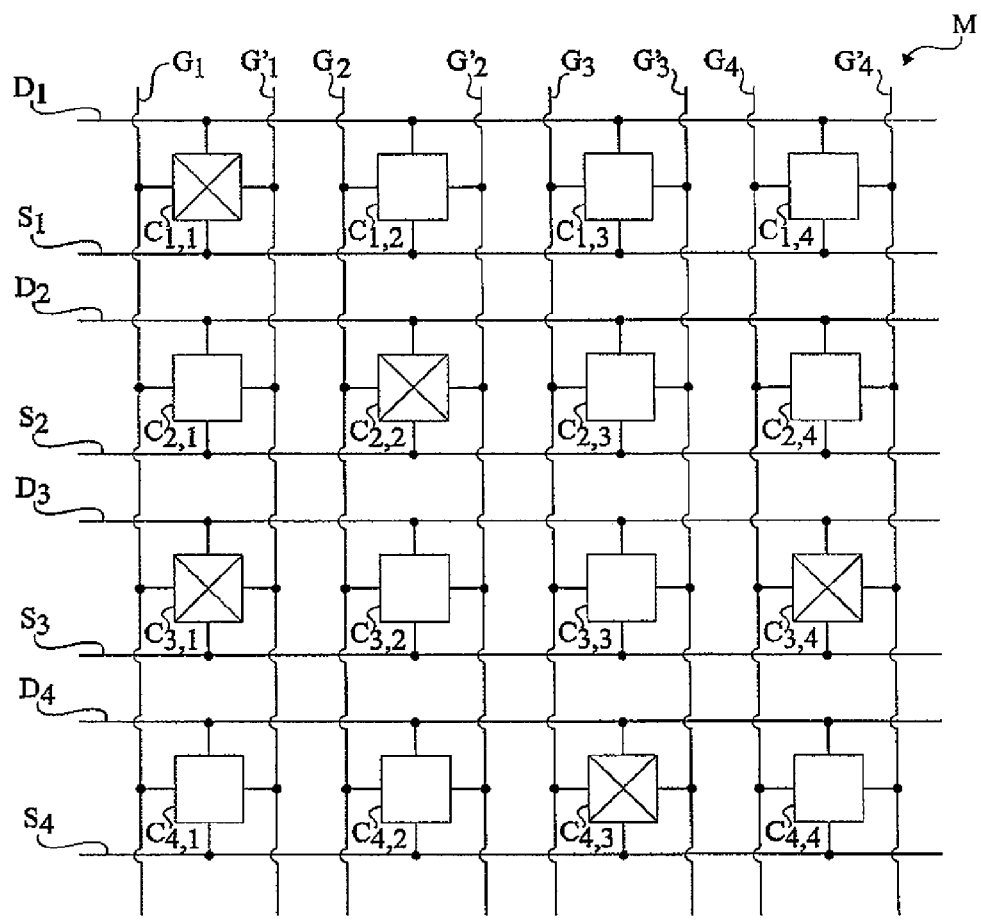
FIG. 3 schematically shows a read-only memory according to an embodiment of the present invention.

FIG. 3 shows a simplified embodiment of a memory M that can operate as a ROM. Memory M may correspond to a portion of a larger memory, not shown, further having the structure of a conventional EEPROM. Memory M comprises memory cells $C_{i,j}$ arranged in rows and in columns, where i and j are integers varying between 1 and 4 in the present embodiment. Some of the memory cells correspond to an unmodified EEPROM cell, for example, cell $Cell_A$ shown in FIG. 1, while others correspond to a modified EEPROM cell, for example, cell $Cell_B$ shown in FIG. 2. More specifically, unmodified memory cells are provided at the locations of memory M where logic value "0" is desired to be stored and modified memory cells are provided at the locations of memory M where logic value "1" is desired to be stored. As an example, cells $C_{1,1}$, $C_{2,2}$, $C_{3,1}$, $C_{3,4}$, and $C_{4,3}$, indicated by crosses, are modified EEPROM cells and the other memory cells of memory M are unmodified EEPROM cells.

Two tracks $D_i$, $S_i$ are associated with each row of memory M. Track $D_i$ is connected to drains $D_A$, $D_B$ of selection transistors $T_A$, $T_B$ of the memory cells of the row and track $S_i$ is connected to sources $S_A'$, $S_B'$ of memory points $T_A'$, $T_B'$ of the memory cells of the row. Two tracks $G_i$ and $G'_i$ are associated with each column. Track $G_i$ is connected to gates $G_A$, $G_B$ of selection transistors $T_A$, $T_B$ of the memory cells of the column and track $G'_i$ is connected to gates $G_A'$, $G_B'$ of memory points $T_A'$, $T_B'$ of the memory cells of the column.

FIG. 4 illustrates in the form of a block diagram an example of a read cycle in memory M of FIG. 3.

The method starts at step 1 where all the memory cells of memory M are deleted. For this purpose, tracks $G_i$ are set to a given delete potential (for example, positive) to turn on the selection transistors of the memory cells, tracks $D_i$ and $S_i$ are set to 0 volt, and tracks $G'_i$ are set to a given potential. This causes, for each modified and unmodified EEPROM cell, the passing of electrons from drain $D_A'$, $D_B'$ to floating gate $F_A$, $F_B$ of memory point $T_A'$, $T_B'$ of each memory cell through the tunnel window and the accumulation of electrons in floating gate $F_A$, $F_B$ of memory point $T_A'$, $T_B'$. For the unmodified EEPROM cells, the electrons remain stored in floating gate $F_A$ of memory point $T_A'$. For the modified EEPROM cells, the charges very rapidly escape from floating gate $F_B$ of memory point $T_B'$ via the thin insulating layer portion separating floating gate $F_B$ from control gate $G_B'$ of memory point $T_B'$ so that, very soon after the delete step, almost no charge is kept in floating gate $F_B$. The threshold voltage of a transistor $T_B'$ is higher if charges are stored in floating gate $F_B$.

The method carries on at step 2 at which an actual read operation from the memory cells is carried out. As an example, the states of the cells of a same row can be read simultaneously. The reading from a memory cell $C_{i,j}$ is obtained by setting track $G_i$ to a given read potential to turn on selection transistors $T_A$, $T_B$ of the corresponding memory cells, by applying a given read voltage between tracks $D_i$ and $S_i$, and by setting track $G'_i$ to a given potential. The intensity of the current flowing through transistor $T_A'$, $T_B'$ depends on the presence or on the absence of charges stored in floating gate $F_A$, $F_B$. For all the unmodified EEPROM cells, the read step will indicate a logic value "0" since electrons are stored in floating gate $F_A$ of memory points $T_A'$ of the memory cell. For the modified EEPROM cells, the read step will indicate a logic value "1" since there are no electrons stored in floating gate $F_B$ of memory point $T_B'$ of the memory cell.

Thereby, after each read cycle successively comprising delete step 1 and read step 2, the values stored in memory M are the following:

$$\begin{pmatrix} 1 & 0 & 0 & 0 \\ 0 & 1 & 0 & 0 \\ 1 & 0 & 0 & 1 \\ 0 & 0 & 1 & 0 \end{pmatrix}$$

Thus, memory M can be considered as a read-only memory since the previously-described read cycle enables to always obtain the same logic values which only depend on the structure of memory M. Further, since the read cycle starts with a delete operation in all the memory cells, the operation of memory M is not disturbed by the presence of unmodified EEPROM cells which would be "defective", that is, for which the charge retention capacity in the floating gate (measured in number of read cycles) would be smaller than the capacity usually required for a conventional EEPROM cell. Indeed, since the delete step is followed by the actual read step, the global charge stored at the delete step in a conventional EEPROM cell does not have the time to vary when the next read step is carried out, even if the cell is "defective". The operation of memory M is thus reliable along time.

At the step of writing into an EEPROM cell of a conventional EEPROM, the evacuation of the electrons of floating gate $F_A$ of transistor $T_A'$ through the tunnel window goes along with an injection of holes into floating gate $F_A$ through the tunnel window. When the applied voltages are the same, it can be observed that the threshold voltage of a transistor $T_A'$ of a memory cell after a write operation decreases more than the threshold voltage of a transistor $T_B'$ of a modified EEPROM cell, the electrons of which have escaped from floating gate $F_B$ to control gate $G_B'$. Thereby, during a read cycle of memory M, the delete potential applied to the control gate of the transistors may be greater than the delete potential applied in a delete step in a conventional EEPROM. This enables storing more charges in the floating gate of the transistors of memory M and to increase the threshold voltage difference between the cells of memory M in which charges are stored and the cells of memory M, from which the charges have escaped through the control gate.

FIG. 5 schematically shows an electronic circuit 3 comprising a memory 4 having a portion 5 (EEPROM) corresponding to an EEPROM and a portion 6 (ROM) corresponding to a read-only memory, for example, the memory previously described in relation with FIG. 3. Electronic circuit 3 further comprises another integrated circuit 7 (IC), for example, an interface circuit, connected to memory 4 by a connection 8, for example, a data exchange bus, for the writing of data in portion 5 of memory 4 and for the reading of data stored into portions 5 or 6 of memory 4.

FIG. 6A is a lateral cross-section view of a memory cell $Cell_B$ of the type of that of FIG. 2. FIG. 6B is a cross-section view of FIG. 6A along line A-A and FIG. 6C is a cross-section view of FIG. 6A along line B-B.

Cell $Cell_B$ is formed in an active region of a semiconductor substrate 10, typically made of single-crystal silicon, laterally delimited by field insulation areas 12 (STI, FIG. 6B). The gate structures of transistor $T_B$ and of memory point $T_B'$ are formed above substrate 10. The gate of transistor $T_B$ is formed of a stack of a first insulating portion 13, of a first conductive portion 14, of a second insulating portion 15, and of a second conductive portion 16. It may be desirable for the operation of transistor $T_B$ to be similar to that of a conventional single-gate MOS transistor. For this purpose, conductive portions 14 and 16 may be short-circuited by metal tracks and vias, not shown.

The gates of memory point $T_B'$ are formed of a stack of a first insulating portion 20, of a first conductive portion 21, of a second insulating portion 22, and of a second conductive portion 23. In FIG. 6B, other conductive portions 24 extending on substrate 10 and which do not belong to memory cell $Cell_B$ have been shown. Conductive portion 21 forms the floating gate of memory point $T_B'$. Conductive portion 23 forms the control gate of memory point $T_B'$. Conductive portion 23 may correspond to a conductive strip and may also form the control is gate of other memory points. Insulating portion 20 comprises a relatively thick portion 25 forming the non-tunnel portion of the insulator of floating gate 21 and a relatively thin portion 26 forming the tunnel oxide area. Oxide portion 26 thinner than portion 25 extends across the entire width of the active area to the top of field insulation areas 12. Spacers 27 are formed on either side of transistor $T_B$ and of memory point $T_B'$.

For modified EEPROM cell $Cell_B$, insulating portion 22 comprises a relatively thick portion 28 and a relatively thin portion 29. Unmodified EEPROM cell $Cell_A$ may have the same structure as that shown in FIGS. 6A to 6C, with the difference that insulating portion 22 substantially has a constant thickness.

Conductive portions 21 and 23 are for example made of polysilicon and have a thickness, respectively, of approximately 100 nm and of approximately 200 nm. Insulating portion 20 is made of oxide, for example, silicon oxide ($SiO_2$). Thick portion 28 of insulating portion 22 for example comprises an oxide-nitride-oxide stack ("ONO" stack) of a total thickness of approximately 180 nm. As an example, in the ONO stack, the oxide may be silicon oxide and the nitride may be silicon nitride. Thin portion 29 of insulating portion 22 for example corresponds to a silicon oxide portion having a thickness of a few nanometers, for example, from 2 to 3 nm. Generally, thick portion 28 has a thickness greater than 100 nm and thin portion 29 has a thickness smaller than 5 nm.

On either side of transistor $T_B$ and of memory point $T_B'$, implantation areas 30 of the drain and source of transistor $T_B$ and of the drain and source of memory point $T_B'$ are formed in silicon substrate 10 (the source region of transistor $T_B$ and the drain region of memory point $T_B{}'$ join). Two other implantation areas 31 are formed at the surface of substrate 10 and partly extend under insulating portion 25 of memory point $T_B{}'$.

As an example, memory point $T_B{}'$ has, in cross-section plane B-B, a substantially rectangular cross-section with a large side $L_1$ of 840 nm and a small side $l_1$ of 640 nm. Thinned-down portion 29 is, for example, centered with respect to memory point $T_B{}'$. It for example has, in cross-section plane B-B, a substantially rectangular cross-section with a large side $L_2$ of 400 nm and a small side $l_2$ of 320 nm.

The presence of portion 29, which is less insulating than the portion 28 usually provided between the two gates of a memory point $T_A{}'$ of an EEPROM cell, enables leakage of charges stored in floating gate 21. The dimensions of thin portion 29 are selected so that the charge evacuation is as fast as possible. The applicant has shown that, for the dimensions of thin portion 29 previously given as an example, the number of charges stored in floating gate 21 after the deleting step substantially decreases by 90% within a few milliseconds.

FIGS. 7A to 7J are lateral cross-section views of structures obtained at successive steps of a method for manufacturing a modified EEPROM cell such as cell $Cell_B$ shown in FIG. 6A. FIGS. 8A to 8J are cross-section views, respectively, of FIGS. 7A to 7J along line C-C (shown in FIG. 7A).

FIGS. 7A and 8A show the structures obtained after the steps of:

forming, in a P-type doped single-crystal silicon substrate 80, insulating wells 81 (STI) of the memory cells;

forming N-type doped regions 82, corresponding to areas 31 of FIG. 6A, in substrate 80; and forming an oxide layer 83 covering the assembly of the selection transistor and of the memory point. As an example, layer 83 may be made of silicon oxide.

FIGS. 7B and 8B show the structures obtained after having etched layer 83 to eliminate a portion of it (opening 85) at the level of the tunnel window of the memory point. As an example, opening 85 may be formed by wet etch.

FIGS. 7C and 8C show the structure obtained after having formed an insulating layer on the structure of FIGS. 7B and 8B. Thus, insulating region 86 resulting from this last layer and from the underlying layer 83 comprises a portion of lower thickness at the level of opening 85. The insulating layer of the floating gate of the memory point and the first insulating layer of the selection transistor are thus formed.

FIGS. 7D and 8D show the structures obtained after having formed a polysilicon layer 87 over the entire structure.

FIGS. 7E and 8E show the structures obtained after having etched polysilicon layer 87 to form openings 88 separating the EEPROM cell from adjacent cells. Openings 88 are formed above insulation wells 81 (STI).

FIGS. 7F and 8F show the structures obtained after having formed, on layer 87 and on the walls and the bottom of openings 88, an insulating layer 89. As an example, insulating layer 89 may be formed of an oxide-nitride-oxide (ONO) stack, for example, formed of a first silicon oxide layer 90, of a silicon nitride layer 91, and of a second silicon oxide layer 92.

FIGS. 7G and 8G show the structures obtained after having formed an opening 94 in the ONO stack (90, 91, 92) and after having formed, on polysilicon layer 87 at the level of opening 94, an insulating layer 96. As an example, opening 94 may be obtained by two successive etch operations: a dry etch to etch oxide layer 92 and nitride layer 91, followed by a wet etch to remove oxide layer 90. Insulating layer 96 may be obtained by oxidation of polysilicon layer 87. Insulating portion 96 corresponds to thin portion 29 of memory cell $Cell_B$ of FIG. 6A.

FIGS. 7H and 8H show the structures obtained after having formed a polysilicon layer 98 on the structure of FIGS. 7G and 8G.

FIGS. 7I and 8I show the structures obtained after having delimited the gates of the selection transistor and of the memory point and formed the source and drain regions of the selection transistor and of the memory point. For this purpose, the assembly of polysilicon layer 98, of the ONO stack (90, 91, 92), of first polysilicon layer 87, and of insulating layer 86 is etched to form openings 100. N-type doped regions 102 are then formed in substrate 80, at the level of openings 100, to form the sources and the drains of the selection transistor and of the memory point.

FIGS. 7J and 8J show the structures obtained after having formed a thin insulating layer 104, above and on the sides of the selection transistor and of the memory point. Insulating layer 104 may be obtained by thermal oxidation. Spacers can then be formed, by any usual method, on either side of the selection transistor and of the memory point.

The previously-described method for forming memory cells enables to simultaneously form modified EEPROM cells and unmodified EEPROM cells. Indeed, it is sufficient, at the step previously described in relation with FIGS. 7G and 8G, to only form thin portions 96 for the modified EEPROM cells, and no to etch insulating layer 89 for the unmodified EEPROM cells. The previously-described method can thus be implemented to form a memory comprising a first portion corresponding to an EEPROM and a second portion corresponding to a read-only memory.

Further, as compared with a usual EEPROM cell forming method, this method has the advantage of requiring no additional steps. Indeed, usually, when EEPROM cells are formed, low-voltage single-gate MOS transistors are also formed on the same substrate. The low-voltage transistors are formed on and in substrate regions at the level of which polysilicon layer 87 is removed. The gate insulator and the gate of the low-voltage transistors are respectively formed by insulating layer 96 and by polysilicon layer 98. To obtain the structure of FIGS. 6A to 6C, it is thus sufficient to modify the mask usually used to remove the ONO stack at the level of low-voltage transistors by adding an opening thereto at the level of opening 94. Further, the structure of FIGS. 6A to 6C has the advantage of being fully compatible with the other cells in terms of programming, reading, and writing.

Advantageously, the dimensions and the position of thin portion 96 are selected so that thin portion 96 is completely surrounded with thicker portion 89. This enables, at the step previously described in relation with FIGS. 7I and 8I, to only have an etching of thick stack 89 for all the memory cells. This enables not modifying the conventional EEPROM manufacturing process for this step. Indeed, if insulating stack 89 had to be etched for unmodified EEPROM cells and if thin portion 96 had to be etched for modified EEPROM cells, two separate etch steps would have to be provided, given the different thicknesses and structures of insulating portions 89 and 96.

As compared with a conventional ROM, the interconnect tracks associated with the memory according to the present embodiment are not modified for the programming. Accordingly, the programming of the memory according to the present embodiment is invisible as seen from above the metallization or by analysis of the mask used for this metallization, or again by performing successive cross-sections to reconstitute this mask (delayering).

Further, it may be provided to add parasitic patterns to prevent a possible analysis of the mask used to form openings 94, for example, by providing such openings at the level of the STI insulating trenches.

Specific embodiments of the present invention have been described. Different variations and modifications will occur to those skilled in the art. In particular, although the present invention has been described for a memory cell comprising a memory point and a selection transistor, it should be clear that the present invention can be implemented for any type of EEPROM cell comprising a dual-gate transistor having a floating gate. Such is the case, for example, for a Flash memory for which, as compared with the cell shown in FIG. 1, the memory cell may comprise memory point $T_A'$ only.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. A non-volatile memory comprising at least first and second memory cells, each comprising a first storage MOS transistor with a dual gate having an insulating layer interposed between the two gates, wherein the insulating layer of the storage transistor of the second memory cell comprises at least one portion which is less insulating than the insulating layer of the storage transistor of the first memory cell, wherein the first and second memory cells are interconnected to operate as memory cells of a read only memory and wherein the first and second memory cells are configured to store different logic values of the read only memory.

2. The memory of claim 1, wherein the insulating layer of the storage transistor of the first memory cell has a first thickness greater than 100 nm and wherein said portion of the insulating layer of the storage transistor of the second memory cell has a second thickness smaller than 5 nm.

3. The memory of claim 2, wherein the insulating layer of the storage transistor of the second memory cell comprises an additional portion having the first thickness completely surrounding said portion having the second thickness.

4. The memory of claim 1, wherein the insulating layer of the storage transistor of the first memory cell having a first thickness is formed of a stack of a first silicon oxide layer, of a silicon nitride layer, and of a second silicon oxide layer and wherein the portion having a second thickness of the insulating layer of the storage transistor of the second memory cell is formed of a third silicon oxide layer.

5. The memory of claim 1, wherein the storage transistor of the first and second memory cells comprises a stack of a first insulating layer, of a first gate, of a second insulating layer, and of a second gate, the second insulating layer of the storage transistor of the second memory cell comprising said at least one portion, and wherein the memory further comprises a substrate of a semiconductor material, the first insulating layer covering the substrate and comprising a first insulating portion thinner than a second insulating portion.

6. An electronic system comprising the memory of claim 1 and an integrated circuit separate from the memory and connected to the memory.

7. A method for reading a non-volatile memory of claim 1, comprising the successive steps of:
   injecting, for each of the first and second memory cells, charges into a first gate from among the two gates of the storage transistor, which results, for the first memory cell, in a storage of the charges in the first gate and, for the second memory cell, in an evacuation of the charges from the first gate to the other one of the two gates; and
   measuring data representative of the charges stored in the first gate for the first and second memory cells.

8. A method for forming a memory comprising at least first and second memory cells each comprising a dual-gate MOS storage transistor having an insulating layer interposed between the two gates, and comprising the step of forming, in the insulating layer of the storage transistor of the second memory cell, at least one portion which is less insulating than the insulating layer of the storage transistor of the first memory cell, wherein the first and second memory cells are interconnected to operate as memory cells of a read only memory and wherein the first and second memory cells are configured to store different logic values of the read only memory.

9. The method of claim 8, comprising, for each of the first and second memory cells, after a step of forming a first gate of the storage transistor and before a step of forming a second gate of the storage transistor, the successive steps of:
   forming, for the first and second memory cells, on the first gate, a first insulating layer;
   forming, only for the second memory cell, an opening in the first insulating layer;
   forming, in said opening, a second insulating layer which is less insulating than the first insulating layer.

10. The method of claim 9, wherein the first insulating layer is formed of a stack of a first silicon oxide layer, of a silicon nitride layer, and of a second silicon oxide layer, and wherein the second insulating layer is formed of a third silicon oxide layer.

11. A memory device comprising:
    a substrate;
    a first memory cell formed on the substrate, the first memory cell comprising a first storage MOS transistor having a first floating gate and a first control gate with a first insulating layer between the first floating gate and the first control gate; and
    a second memory cell formed on the substrate, the second memory cell comprising a second storage MOS transistor having a second floating gate and a second control gate with a second insulating layer between the second floating gate and the second control gate, wherein the second insulating layer is less insulating than the first insulating layer, wherein the first and second memory cells are interconnected for operation as memory cells of a read only memory and wherein the first and second memory cells are configured to store different logic values of the read only memory.

12. A memory device as defined in claim 11, wherein the first insulating layer has a first thickness and wherein at least a portion of the second insulating layer has a second thickness that is less than the first thickness.

13. A memory device as defined in claim 12, wherein the second insulating layer includes a thick portion and further includes a thin portion having the second thickness.

14. A memory device as defined in claim 13, wherein the thick portion of the second insulating layer comprises an oxide-nitride-oxide stack.

15. A memory device as defined in claim 14, wherein the thin portion of the second insulating layer comprises silicon oxide.

16. A memory device as defined in claim 13, wherein the thick portion of the second insulating layer has a thickness greater than 100 nm and wherein the thin portion of the second insulating layer has a thickness less than 5 nm.

17. A memory device as defined in claim 13, wherein the thick portion of the second insulating layer surrounds the thin portion of the second insulating layer.

18. A memory device as defined in claim 11, wherein the first and second memory cells each include a selection transistor.

19. A memory device as defined in claim 18, including multiple first memory cells and multiple second memory cells.

* * * * *

UNITED STATES PATENT AND TRADEMARK OFFICE
CERTIFICATE OF CORRECTION

PATENT NO. : 8,759,898 B2
APPLICATION NO. : 12/990682
DATED : June 24, 2014
INVENTOR(S) : Pascal Fornara Page 1 of 1

It is certified that error appears in the above-identified patent and that said Letters Patent is hereby corrected as shown below:

In the Specification:

In column 1, line 11, "08153069" should read --08/53069--;

In column 2, line 66, the word "to" should be deleted; and

In column 6, line 38, the word "is" should be deleted.

Signed and Sealed this
Seventh Day of October, 2014

Michelle K. Lee
*Deputy Director of the United States Patent and Trademark Office*